United States Patent
Kadomatsu et al.

(10) Patent No.: US 6,788,806 B2
(45) Date of Patent: Sep. 7, 2004

(54) BOARD-SUPPORTING INSPECTING METHOD

(75) Inventors: Sumio Kadomatsu, Okazaki (JP); Takayoshi Kawai, Okazaki (JP)

(73) Assignee: Fuji Machine Manufacturing Company, Chiryu (JP)

( * ) Notice: Subject to any disclaimer, the term of this patent is extended or adjusted under 35 U.S.C. 154(b) by 513 days.

(21) Appl. No.: 09/745,876

(22) Filed: Dec. 26, 2000

(65) Prior Publication Data

US 2001/0007594 A1 Jul. 12, 2001

(30) Foreign Application Priority Data

Jan. 12, 2000 (JP) ........................................ 2000-003719

(51) Int. Cl.⁷ .................................................. G06K 9/00
(52) U.S. Cl. ...................................... 382/147; 382/151
(58) Field of Search ................................ 382/147, 151; 348/87, 95, 126

(56) References Cited

U.S. PATENT DOCUMENTS

| | | | | |
|---|---|---|---|---|
| 3,838,274 A | | 9/1974 | Doubek, Jr. et al. ........ | 250/201 |
| 4,494,139 A | | 1/1985 | Shima et al. ............... | 358/101 |
| 4,651,203 A | | 3/1987 | Peterson ..................... | 358/101 |
| 4,849,901 A | * | 7/1989 | Shimizu ..................... | 364/468 |
| 5,754,677 A | | 5/1998 | Kawada ...................... | 382/141 |
| 6,317,973 B1 | * | 11/2001 | Kuriyama et al. ............ | 29/840 |

FOREIGN PATENT DOCUMENTS

JP A 8-180191 7/1996 ............. G06T/7/00

OTHER PUBLICATIONS

"Optimale Bestuckungstechnik" Und–Oder–Nor + Steuerungstednik, Distribution Verlag GMBH, Mainz, DE, vol. 19, No. 10, Oct. 1, 1989, pp. 44–45.

* cited by examiner

Primary Examiner—Brian Werner
(74) Attorney, Agent, or Firm—Oliff & Berridge, PLC

(57) ABSTRACT

A method of inspecting whether a printed board is appropriately supported by a supporting device, when a holding device holding an electric component mounts the electric component on the printed board supported by the supporting device, the method including the steps of taking, with an image taking device, an image of at least one prescribed detection portion of the printed board supported by the supporting device, and judging, based on image data representing the taken image of the detection portion, whether the printed board is appropriately supported by the supporting device.

18 Claims, 7 Drawing Sheets

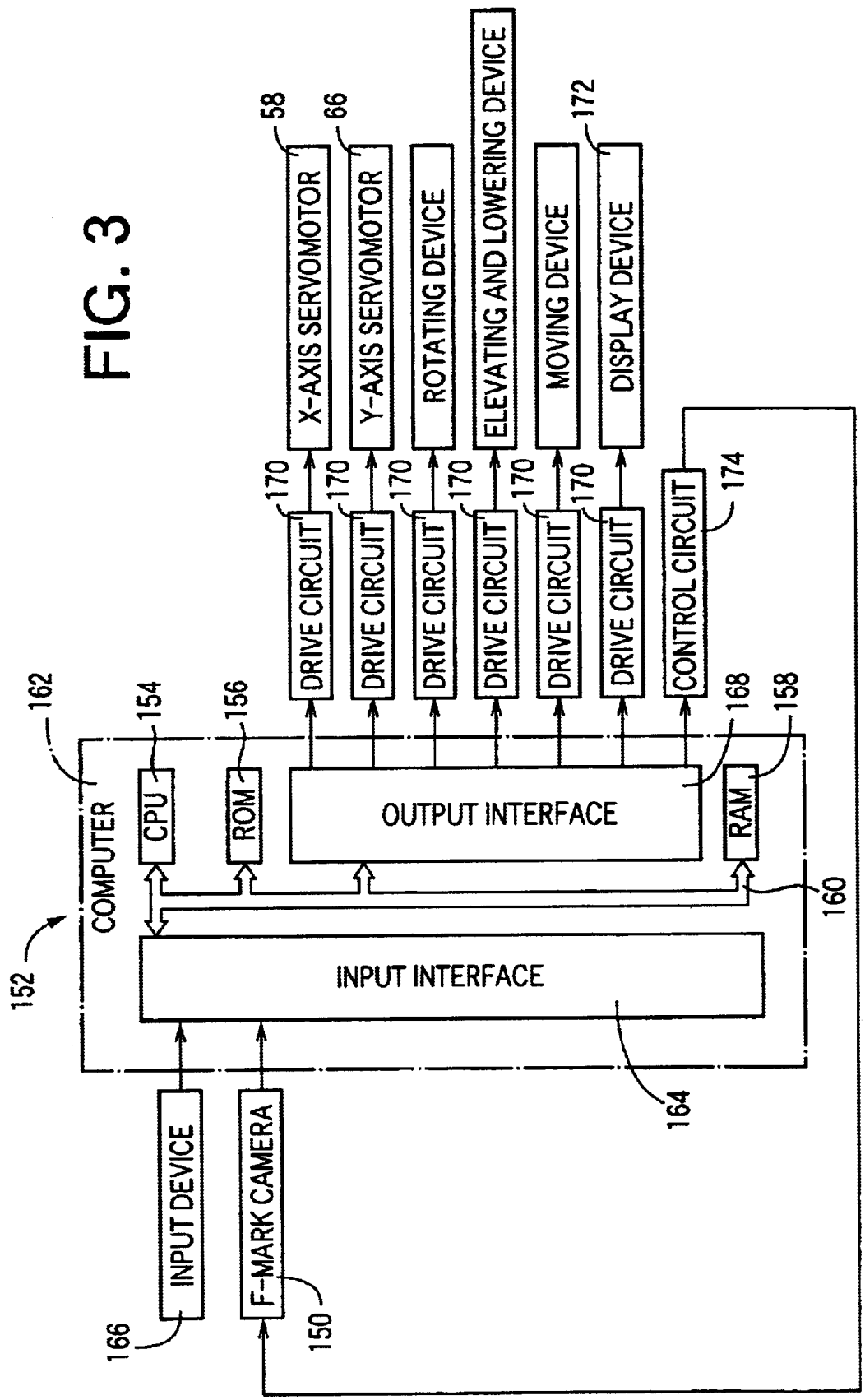

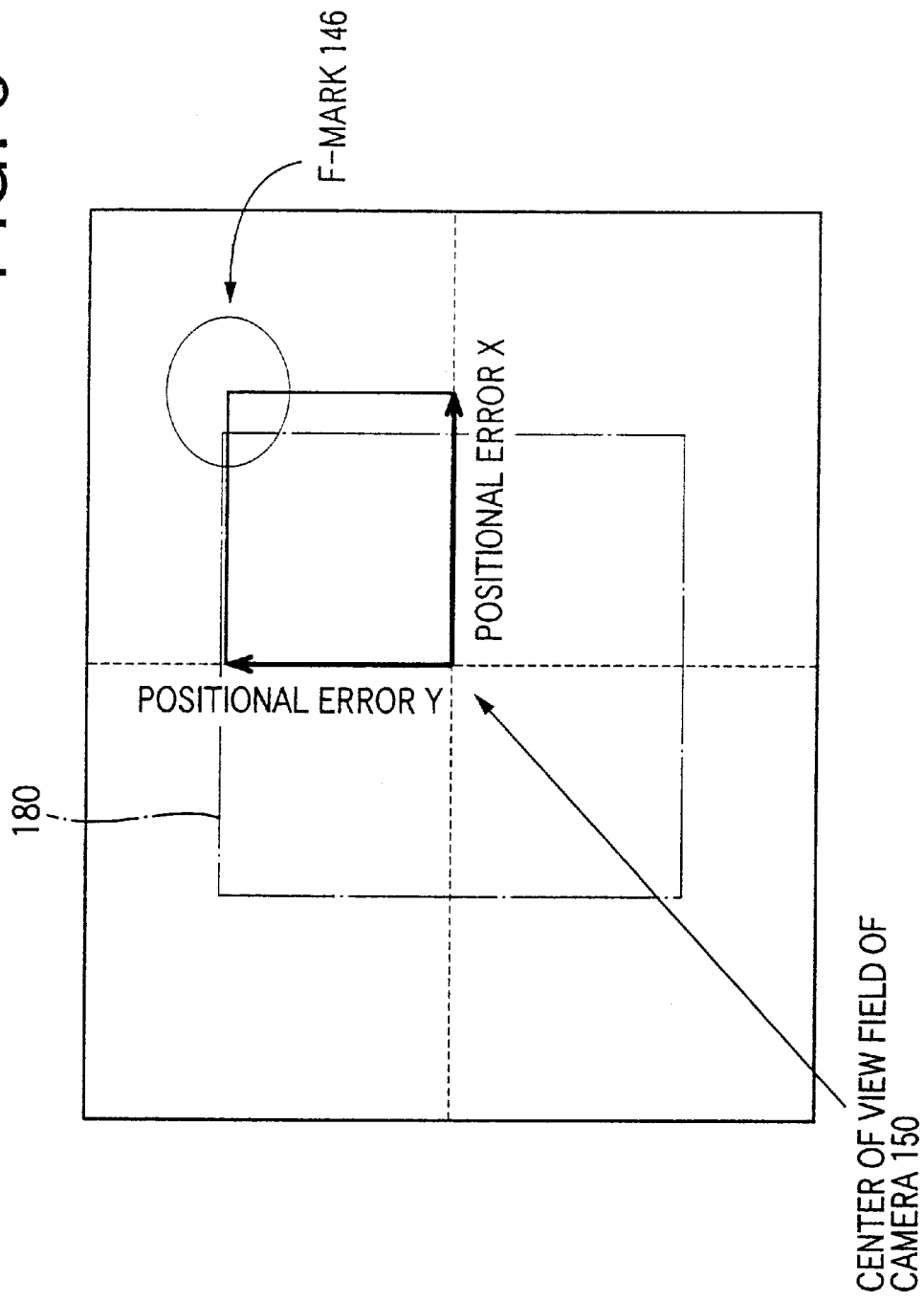

BOARD-SUPPORTING INSPECTING METHOD

BACKGROUND OF THE INVENTION

1. Field of the Invention

The present invention relates to a method of inspecting whether a printed board is appropriately supported in an electric-component mounting apparatus.

2. Discussion of Related Art

There is known an electric-component (EC) mounting apparatus which takes, with an image taking device, an image of a reference mark provided on a printed board (e.g., printed wiring board) which is supported by a supporting device, determines, based on the taken image of the reference mark, a position of the printed board supported by the supporting device, and modifies a prescribed amount of movement of an EC that is needed to position the EC at a position right above an EC-mount location on the printed board. However, the conventional apparatus determines, on the assumption that the printed board is appropriately supported by the supporting device, a positional error of the printed board from a prescribed position thereof, and modifies, based on the determined positional error of the printed board, the prescribed amount of movement of EC that is needed to position the EC at the position right above the EC-mount location on the printed board and mount the EC at the EC-mount location.

Therefore, even in the case where the magnitude of actual positional error of the printed board exceeds a permissible error range which is proper for the supporting device and/or the image taking device, the conventional apparatus may mount one or more ECs on the printed board. In addition, in the case where the actual positional error of printed board is great, a great error or errors tend to occur when the positional error is determined or calculated and/or when the positional error is corrected. More specifically described, if the actual position of the printed board is greatly deviated from the prescribed position thereof, then the image of the reference mark that should be taken around the center of view field of the image taking device is, in fact, taken in a peripheral portion of the view field. However, generally, the image taking device (e.g., camera) tends to have a greater distortion in the peripheral portion of view field (e.g., lens) thereof. Therefore, a greater error tends to occur when the positional error of the printed board is calculated based on the reference-mark image taken by the image taking device. Moreover, if the prescribed amount of movement of EC is greatly modified based on the great positional error of printed board, a great error tends to be included in the modified amount of movement of EC, so that the EC may be mounted, with insufficient accuracy, on the printed board (e.g., printed circuit board).

In addition, if the magnitude of actual positional error of the printed board exceeds the above-indicated permissible error range, then abnormality may have occurred to the EC mounting apparatus itself, or the printed board currently supported by the supporting device may differ from the prescribed sort of printed board. The abnormality with the EC mounting apparatus itself may be such that a board conveyor (i.e., a pair of conveyor belts) has failed to adjust appropriately its board-convey width depending upon the size of current sort of printed boards and accordingly the printed board has been conveyed in an unstable state, or such that the overall shape of the printed board has been deformed because the relative position between the printed board and the supporting device in a vertical direction is not appropriate.

FIGS. 6A, 6B, and 6C show a case where an EC 206 is mounted on a second, upper surface 204 of a printed board 200 having, in addition to the second surface 204, a first, lower surface 202 having an EC 206 already mounted thereon. A board supporting device 208 includes at least one board support member 209, and is moved upward from its initial position shown in FIG. 6A, so that the board support member 209 engages the first surface 202 of the printed board 200, as shown in FIG. 6C, and thereby supports the board 200. In this case, the conventional EC mounting apparatus may suffer from the above-described problems. If an actual position of the printed board 200 is largely deviated from its prescribed position, the board support member 209 interferes with the EC 206 already mounted on the first surface 202, as shown in FIG. 6B. Consequently the EC 206 mounted on the first surface 202 is removed from the surface 202, as shown in FIG. 6C, or is moved out of position or changed in its posture on the surface 202, because it has been just temporarily fixed to the surface 202 with creamed solder or adhesive. Even if the EC 206 may be mounted on the second surface 204 of the printed board 200 whose first surface 202 has had the above-indicated abnormality, the printed board 200 will be discarded as a defective product. Therefore, the one or more ECs 206 mounted on the second surface 204 and the time needed to mount the ECs 206 on the second surface 204 are used to waste.

When the EC 206 already mounted on the first surface 202 is interfered with by the board support member 209, the EC 206 may not be removed off the first surface 202 or be moved out of position. In this case, however, the printed board 200 is supported by the board supporting device 208 in the state in which the EC 206 is sandwiched between the board 200 and the support member 209, so that the board 200 is pushed up by the EC 206 and its shape is deformed. In this state, it is difficult to mount appropriately the EC or ECs 206 on the second surface 204 of the board 200. Eventually, the board 200 will probably be defective. These problems have been more and more serious because of a recent demand to increase the density of mounting of ECs.

SUMMARY OF THE INVENTION

The present invention provides a board-supporting inspecting method, an electric-component mounting apparatus, and an inspecting-program recording medium which have one or more of the following technical features that are described below in respective paragraphs given parenthesized sequential numbers (1) to (16). Any technical feature that includes another technical feature shall do so by referring, at the beginning, to the parenthesized sequential number given to the latter feature. However, the following technical features and the appropriate combinations thereof are just examples to which the present invention is by no means limited. In addition, in the case where one technical feature recites a plurality of items, it is not essentially required that all of those items be simultaneously employed. That is, it is possible to select and employ only a portion (one, two, . . . , but not all) of those items.

(1) According to a first feature of the present invention, there is provided a method of inspecting whether a printed board is appropriately supported by a supporting device, when a holding device holding an electric component mounts the electric component on the printed board supported by the supporting device, the method comprising the steps of taking, with an image taking device, an image of at least one prescribed detection portion of the printed board supported by the supporting device, and judging, based on image data representing the taken image of the detection portion, whether the printed board is appropriately supported by the supporting device. The image taking device can be regarded as a sort of detecting device which detects the prescribed or predetermined detection portion of the printed board.

In a conventional EC mounting method, a relative position of the printed board relative to the EC holding device is determined based on a relative position of a reference mark, as a sort of prescribed detection portion of the printed board, relative to the image taking device, and an amount of relative movement between the EC holding device and the board supporting device is modified based on the determined position of the printed board, so that the EC held by the holding device is accurately mounted on the printed board supported by the board supporting device. In contrast thereto, the present inspecting method judges, based on the taken image of the detection portion of the printed board, whether or not the printed board is appropriately supported by the board supporting device.

Taking an image of a reference mark of a printed board before an EC is mounted on the printed board has been widely practiced. Since the present method can inspect, based on information obtained by taking the image of the reference mark, whether the printed board is appropriately supported, the present method can be easily carried out on a conventional EC mounting apparatus. In addition, since the present method does not need any additional steps or actions of the mounting apparatus, the present method can avoid the lowering of operation efficiency of the mounting apparatus.

The present method can inspect whether the printed board is appropriately supported, before one or more ECs are mounted on the printed board. If whether or not to carry out the EC mounting operation is decided based on the result of the inspection, it is possible to prevent the wasteful use of ECs and improve the operation efficiency. For example, if the result of the inspection is positive, it is possible to allow the current EC mounting operation to continue; and if the result is negative, it is possible to inform an operator of the negative result so that the operator can make his or her own judgment. Alternatively, the EC mounting apparatus may be controlled by a control device to find one or more causes of the abnormality with the printed board.

The prescribed detection portion of the printed board may be a prescribed portion of a circuit pattern of a printed wiring board or a printed circuit board each as the printed board, or may be a reference mark (e.g., a fiducial mark) which is provided on at least one of opposite surfaces of the printed board.

(2) According to a second feature of the present invention that includes the first feature (1), the step of taking comprises taking an image of at least one reference mark provided on the printed board supported by the supporting device, and the step of judging comprises determining, based on image data representing the taken image of the reference mark, at least one actual position of the printed board supported by the supporting device; and judging, based on the determined actual position of the printed board, whether the printed board is appropriately supported by the supporting device.

The at least one actual position of the printed board may be at least one of a position of the board in an X direction parallel to the board, a position of the board in a Y direction parallel to the board and perpendicular to the X direction, and a position of the board in a Z direction perpendicular to the X and Y directions.

(3) According to a third feature of the present invention that includes the first or second feature (1) or (2), the inspecting method further comprises the step of outputting, with an output device, information representing a result of the judgment, such that the output information is recognizable by an operator.

The output device may output both a positive and a negative result of the judgment, or may output only the negative result. Even in the former case, it is preferred that the negative result be output in a more distinct manner than a manner in which the positive result is output. Moreover, it is possible to output, in addition to the result of the current judgment, the accumulated results of the past judgments and/or the frequency at which the negative results are obtained during the current, continuous operation.

Since the present inspecting method can timely inform the operator of the result of judgment, the operator can quickly respond to the abnormality with the printed board.

(4) According to a fourth feature of the present invention that includes the third feature (3), the step of outputting comprises outputting information representing a negative result of the judgment.

The present method can allow, when the result of judgment is positive, the current EC mounting operation to continue and output, when the result is negative, information indicating the result is negative, so that the operator can make his or her own inspection or judgment.

(5) According to a fifth feature of the present invention that includes any one of the first to fourth features (1) to (4), the inspecting method further comprises the step of, when it is judged that the printed board is not appropriately supported by the supporting device, stopping a mounting operation in which the holding device will mount the electric component on the printed board judged as being not appropriately supported by the supporting device.

The present method stops, when the result of judgment is negative, the EC mounting operation, thereby preventing the EC from being mounted on the printed board judged as being not appropriately supported by the supporting device. Thus, the present method can prevent wasteful use of ECs and wasteful EC mounting operations. Then, the operator may check the printed board and/or the EC mounting apparatus (e.g., the board supporting device) and decide, based on the result of checking, whether to allow the EC mounting operation or to discharge the current printed board from the board supporting device. Alternatively, the EC mounting apparatus may automatically re-adjust each of the elements thereof, as described below.

For example, if the abnormality with the printed board is caused by inappropriate adjustment of the board-convey width of a board conveying device of the mounting apparatus, or by inappropriate adjustment of the height position of the printed board supported by the board supporting device, the EC mounting apparatus may automatically re-adjust the board-convey width or the height position because the inappropriate board-convey width or the inappropriate height position can be corrected by the re-adjustment thereof. If a positive result is obtained when the present inspecting method is carried out again, it is possible to resume the EC mounting operation; and if a negative result is obtained, it is possible to output information indicative of the second negative result, thereby requesting the operator to make his or her re-judgment. Even though the printed board may be placed in the state appropriately supported by the supporting device as a result of automatic re-adjustment, the EC mounting apparatus may, however, have an abnormality, if the automatic re-adjustments are frequently carried out. In this case, it is preferred to output information indicative of the frequent re-adjustments, so that the operator can find one or more causes of the frequent re-adjustments.

(6) According to a sixth feature of the present invention that includes any one of the second to fifth features (2) to (5), the step of judging comprises judging whether the printed board is appropriately supported by the board supporting device, based on at least one actual position of the reference mark in the image taken by the image taking device, and at least one prescribed position of the reference mark as at least one reference position thereof.

The prescribed position of the reference mark may be any position in the field of view of the image taking device, preferably at the center of the view field.

(7) According to a seventh feature of the present invention that includes the sixth feature (6), the step of judging comprises prescribing a two-dimensional permission range as the reference position of the reference mark, and judging whether the actual position of the reference mark in the taken image falls within the prescribed permission range.

The prescribed permission range may be a circular or square area whose center coincides with the X and Y coordinates of the prescribed position as the reference position of the reference mark, or may have a shape having different dimensions in the X and Y directions.

(8) According to an eighth feature of the present invention that includes any one of the first to seventh features (1) to (7), the step of taking comprises taking, when the holding device mounts the electric component on one of opposite surfaces of the printed board the other surface of which has at least one electric component already mounted thereon and is engaged with the supporting device, the image of the detection portion of the one surface of the printed board.

The present inspecting method inspects whether the first surface of the printed board is appropriately supported, in the state in which the first surface has one or more ECs already mounted thereon. Therefore, the present method can monitor or judge whether the supporting device interferes with the EC or ECs mounted on the first surface of the printed board.

As explained previously, the EC or ECs are just temporarily fixed to the first surface of the printed board, with, e.g., creamed solder. In this state, one or more ECs are mounted on the second surface of the same board. Therefore, if the board is supported at an incorrect position by the supporting device, the supporting device may interfere with the EC or ECs temporarily fixed to the first surface, so that the EC or ECs may fall down off the first surface. Thus, when the present method judges that the board is not appropriately supported before one or more ECs are mounted on the second surface, it is preferred to stop the current EC mounting operation and request the judgment of the operator, to the re-adjustment of the element or elements of the EC mounting apparatus. For example, the operator can check the first surface of the board and decide, based on the result of checking, whether to resume the current EC mounting operation or to discharge the current board from the supporting device.

(9) According to a ninth feature of the present invention that includes the eighth feature (8), the supporting device comprises at least one support member having at least one two-dimensional support spot which supports the printed board by engaging the other surface thereof at at least one support location prescribed for a sort of the printed board, and the step of prescribing comprises prescribing the permission range which assures that the support member of the supporting device does not interfere with the electric component already mounted on the other surface of the printed board.

Since the prescribed permission range assures that the support member does not interfere with any ECs already mounted on the other surface of the printed board, the present inspecting method can monitor or judge whether the support member interferes with the EC or ECs mounted on the other surface of the printed board. In the case where the supporting device includes a plurality of support members, the permission range is so prescribed as to assure that every support member does not interfere with any ECs already mounted on the other surface of the printed board.

(10) According to a tenth feature of the present invention that includes any one of the first to ninth features (1) to (9), the step of judging comprises judging whether the printed board is appropriately supported by the supporting device in each of a first direction and a second direction which are parallel to the printed board supported by the supporting device and are perpendicular to each other.

The first and second directions may be an X-axis direction and a Y-axis direction, respectively, on an X-Y coordinate system parallel to the printed board.

(11) According to an eleventh feature of the present invention that includes any one of the first to tenth features (1) to (10), the step of judging comprises judging whether the printed board is appropriately supported by the supporting device in a direction perpendicular to the printed board supported by the supporting device.

The direction perpendicular to the printed board may be a Z direction perpendicular to the X-axis direction and Y-axis direction on the X-Y coordinate system parallel to the printed board.

(12) According to a twelfth feature of the present invention that includes the eleventh feature (11), the step of judging comprises judging whether a rate of change of respective optical characteristic values at respective positions on a line intersecting an edge line of the taken image of the detection portion, with respect to a direction along the line, is greater than a threshold value and, if a negative judgment is made, judging that the printed board is not appropriately supported by the supporting device in the direction perpendicular to the printed board. The rate of change may be the greatest one of respective rates of change of the respective optical characteristic values at the respective positions on the intersecting line, as calculated in the direction along the intersecting line. The intersecting line may be a straight line prescribed for an edge line of a reference image of the prescribed portion of the printed board.

(13) According to a thirteenth feature of the present invention, there is provided a method of inspecting whether a printed board is appropriately supported by a supporting device, when a holding device holding an electric component mounts the electric component on the printed board supported by the supporting device, the method comprising the steps of detecting a height position of at leas one prescribed detection portion of the printed board supported by the supporting device, and judging, based on the detected height position of the detection portion, whether the printed board is appropriately supported by the supporting device.

(14) According to a fourteenth feature of the present invention, there is provided an apparatus for mounting at least one electric component on a printed board, comprising a supporting device which supports the printed board by engaging a lower surface thereof; a holding device which holds the electric component and mounts the electric component on the printed board supported by the supporting device; an image taking device which takes an image of at least one detection portion of the printed board supported by the supporting device; and a control device which controls the supporting device, the holding device, and the image taking device to mount the electric component on the printed board, the control device comprising a judging portion which judges, based on image data representing the image of the detection portion taken by the image taking device, whether the printed board is appropriately supported by the supporting device.

The present EC mounting apparatus can carry out the inspecting method according to the first feature (1), and may employ any one of the above-described second to twelfth features (2) to (12).

(15) According to a fifteenth feature of the present invention that includes the fourteenth feature (14), the image taking device takes an image of at least one reference mark which is provided on the printed board supported by the supporting device, the control device further comprises an actual-position determining portion which determines, based on image data representing the image of the reference mark taken by the image taking device, at least one actual position of the printed board supported by the supporting device, and the judging portion judges, based on the determined actual position of the printed board, whether the printed board is appropriately supported by the supporting device.

(16) According to a sixteenth feature of the present invention, there is provided a recording medium in which an inspecting program is recorded such that the inspecting program is readable by a computer to cooperate with an image taking device to inspect whether a printed board is appropriately supported by a supporting device in an electric-component mounting apparatus in which a holding device holding an electric component mounts the electric component on the printed board which is supported by the supporting device, at least one of the holding device holding the electric component and the supporting device supporting the printed board being movable relative to the other of the holding device and the supporting device, the inspecting program comprising the steps of taking, with the image taking device, an image of at least one detection portion of the printed board supported by the supporting device, and judging, based on image data representing the taken image of the detection portion, whether the printed board is appropriately supported by the supporting device If the computer of the EC mounting apparatus reads the inspecting program recorded in or on the present recording medium, the apparatus can carry out the inspecting method according to the first feature (1). The inspecting program recorded in the present recording medium may employ any one of the above-described second to twelfth features (2) to (12).

(17) According to a seventeenth feature of the present invention that includes the sixteenth feature (16), the step of taking comprises taking an image of at least one reference mark which is provided on the printed board supported by the supporting device, the inspecting program further comprises the step of determining, based on image data representing the taken image of the reference mark, at least one actual position of the printed board supported by the supporting device, and the step of judging comprises judging, based on the determined actual position of the printed board, whether the printed board is appropriately supported by the supporting device.

BRIEF DESCRIPTION OF THE DRAWINGS

The above and optional objects, features, and advantages of the present invention will be better understood by reading the following detailed description of preferred embodiments of the invention when considered in conjunction with the accompanying drawings, in which:

FIG. 3 is a diagrammatic view of a control device of the EC mounting system;

FIG. 5 is a view of an image taken by a fiducial-mark camera of the EC mounting system.

DETAILED DESCRIPTION OF PREFERRED EMBODIMENTS

Figure 1:
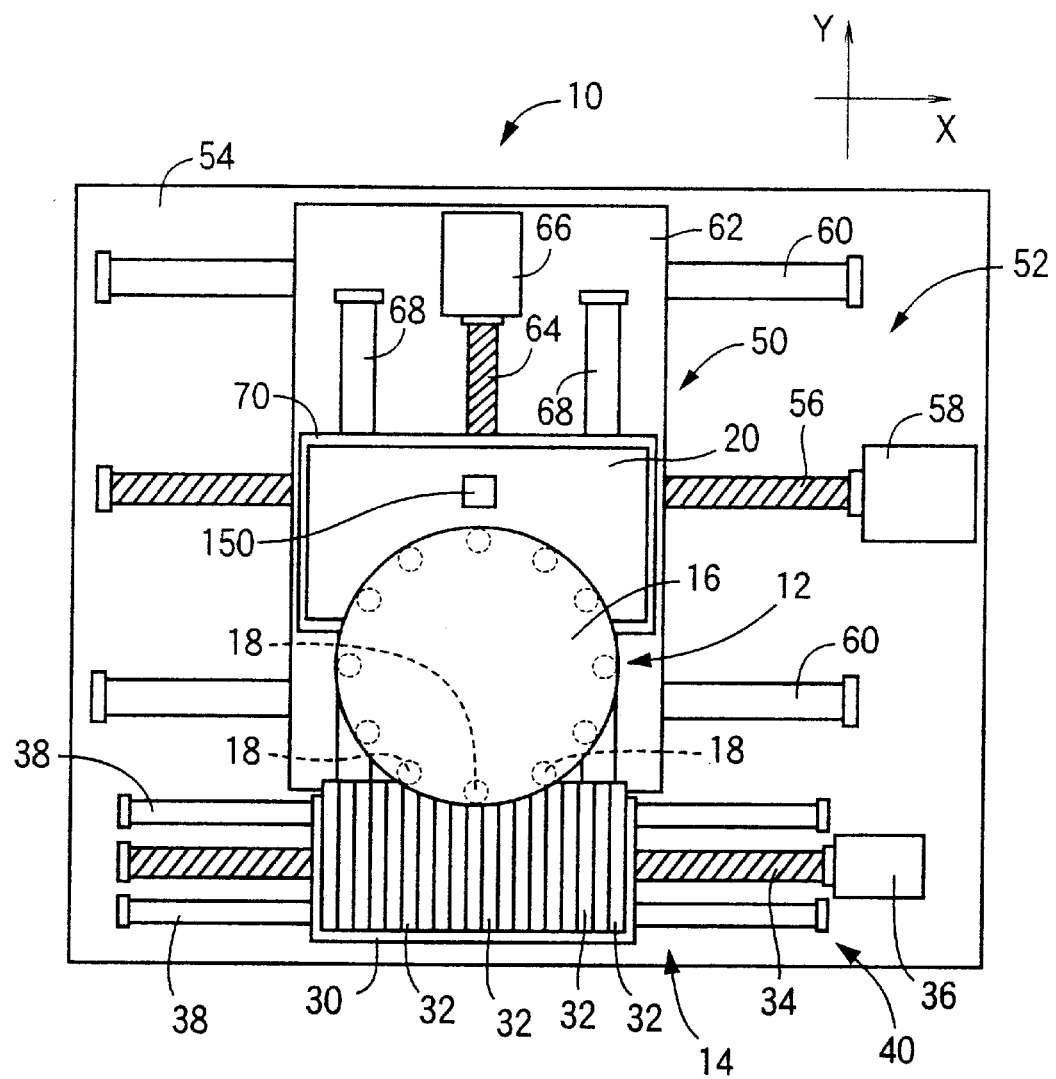
FIG. 1 is a schematic plan view of an electric-component ("EC") mounting system which can perform a board-supporting inspecting method to which the present invention is applied.

Hereinafter, there will be described an electric-component ("EC") mounting system 10 to which the present invention is applied.

The EC mounting system 10 includes an EC mounting device 12, and an EC supplying device 14. The EC mounting device 12 includes an index table 16 which is intermittently rotatable about a vertical axis line. The index table 16 has twelve EC suction heads 18 each of which sucks and holds an EC 17 (FIG. 2) by applying a negative air pressure thereto. The index table 16 supports the twelve EC suction heads 18 such that the suction heads 18 are equiangularly spaced from one another about the vertical axis line. The index table 16 is intermittently rotated by an intermittently rotating device (not shown) including a cam, a cam follower, an axis member, and an indexing servomotor which rotates the cam. As the index table 16 is intermittently rotated, the twelve EC suction heads 18 are sequentially moved to each of a plurality of operation positions including an EC-suck position (i.e., an EC-pick-up position), an EC-posture-detect position, an EC-posture-correct position, and an EC-mount position. At the EC-mount position, each of the EC suction heads 18 mounts an EC 17 on a printed wiring board ("PWB") 20. Each of the EC suction heads 18 functions as an EC mounting head.

The EC supplying device 14 includes a plurality of EC feeders 32 each of which is detachably attached to a feeder-support table 30. The EC feeders 32 are supported on the support table 30 such that respective EC-supply portions of the feeders 32 are arranged along a straight line on a horizontal plane (hereinafter, a direction parallel to this straight line is referred to as the "X direction"). As a ball screw 34 is rotated by an X-axis servomotor 36, the feeder-support table 30 is moved in the X direction while being guided by a pair of guide rails 38. Thus, the EC-supply portion of an appropriate one of the EC feeders 32 is moved to an EC-supply position. The ball screw 34 and the X-axis servomotor 36 cooperate with each other to provide a table moving device 40. In the present embodiment, each of the EC feeders 32 includes a tape feeding device as a sort of EC feeding device, and a tape-reel holding device as a sort of EC storing device, and supplies a plurality of ECs 17 in the form of an EC carrier tape.

The PWB 20 is supported by a PWB positioning and supporting ("P-S") device 52 including an X-Y table 50, and is moved to an arbitrary position on an X-Y plane by the same 52. The PWB P-S device 52, which is disposed with the EC mounting device 12 and the EC supplying device 14 on a common base 54, receives a PWB 20 from a PWB carry-in device (not shown) and discharges the PWB 20 on which one or more ECs 17 have been mounted, to a PWB carry-out device (not shown). The PWB carry-in and carry-out devices include respective pairs of conveyor belts each pair of which convey the PWB 20 in the X direction. As a ball screw 56 provided on the base 54 is rotated by an X-axis servomotor 58, an X table 62 of the X-Y table 50 is moved in the X direction while being guided by a pair of guide rails 60 and, as a ball screw 64 provided on the X table 62 is rotated by a Y-axis servomotor 66, a Y table 70 of the X-Y table 50 is moved in a Y direction perpendicular to the X direction while being guided by a pair of guide rails 68. Each of the servomotors 36, 58, 66 is a sort of electric motor as a drive source, and is an electric rotary motor which is accurately controllable with respect to its rotation angle or amount. The servomotors 36, 58, 66 may be replaced with stepper motors, and the electric rotary motors 36, 58, 66 may be replaced with linear motors.

Figure 2:
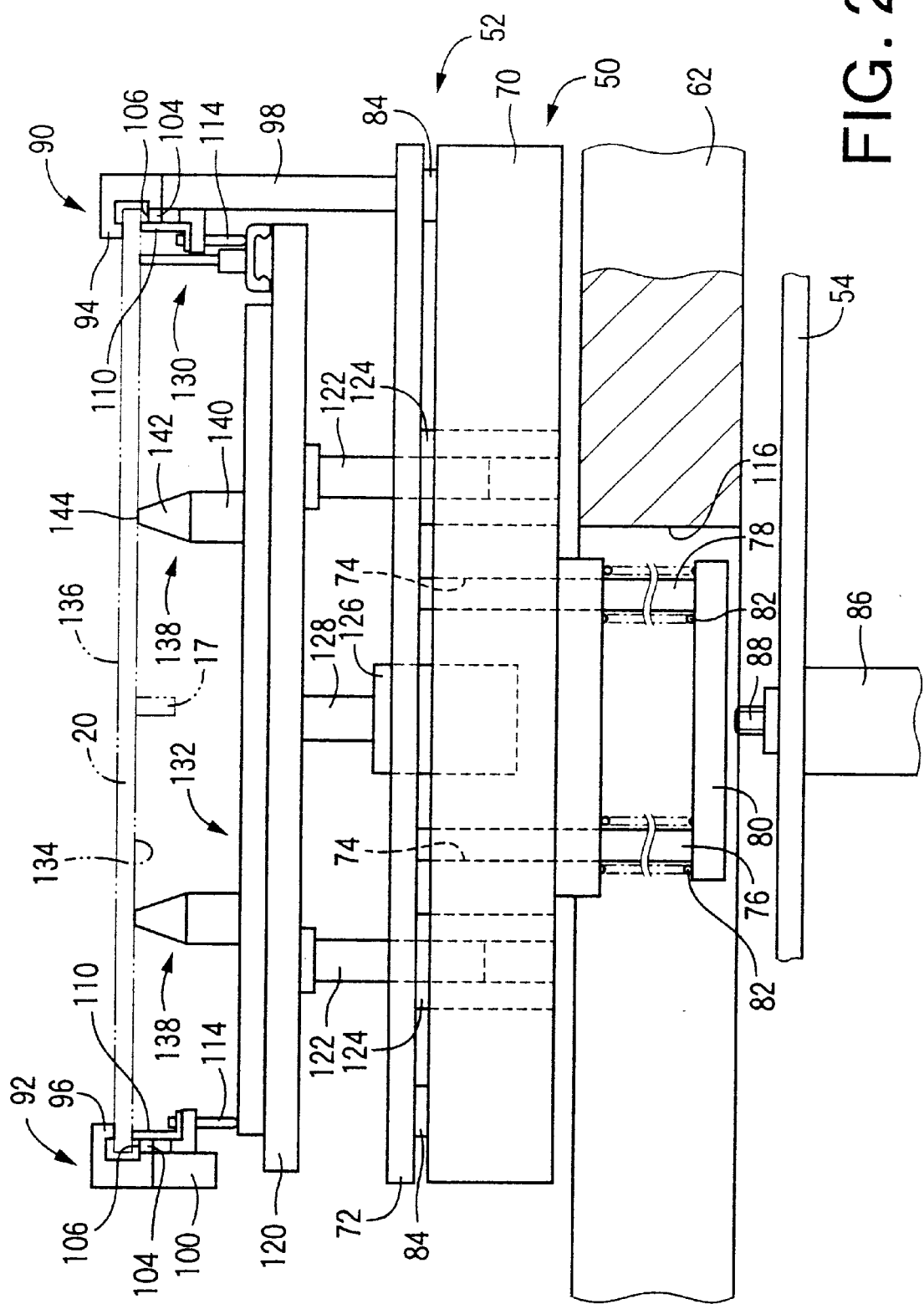
FIG. 2 is a side elevation view of a relevant portion of the EC mounting system.

As shown in FIG. 2, on the Y table 70, there is provided a first elevator table 72 such that the first table 72 is immovable in the X and Y directions relative to the Y table 70 and is movable in a vertical direction, i.e., a Z direction perpendicular to the X and Y directions relative to the Y table 70. The Y table 70 has a pair of through-holes 74, 74 which are formed through the thickness thereof in the Z direction, and a pair of rods 76, 78 extend through the pair of through-holes 74, 74, respectively, such that each of the rods 76, 78 is movable in an axial direction relative to a corresponding one of the holes 74, 74. The first table 72 is fixed to respective upper end portions of the two rods 76, 78 that project upward from the Y table 70.

Respective lower end portions of the two rods 76, 78 that project downward from the Y table 70 are connected to a connection bar 80. Two compression coil springs 82 each as an elastic member as a sort of biasing device are fitted on the respective lower end portions of the two rods 76, 78 that project downward from the Y table 70. Respective lower ends of the two springs 82 are seated on the connection bar 80. Owing to respective biasing forces of the two springs 82, the first table 72 is kept at its lower movement-end position where the first table 72 contacts stoppers 84 provided on the Y table 70. On the base 54, there is provided an air cylinder 86 as a sort of fluid-pressure-operated cylinder device as a drive source. The connection bar 80 is lifted up by an adjustable bolt 88 fixed to a piston rod of the air cylinder 86, so that the first table 72 is moved to its upper movement-end position where the first table 72 is apart a predetermined distance upward from the Y table 70.

On the first table 72, there are provided a fixed guide 90 and a movable guide 92. Each of the fixed and movable guides 90, 92 has an elongate shape having a rectangular cross section. The two guides 90, 92 include respective hold-down portions 94, 96 projecting from respective upper end portions thereof. The fixed guide 90 is fixed to a plate-like support member 98 such that the fixed guide 90 extends parallel to the X direction. The support member 98 is fixed to one of two sides of the first table 72 that are parallel to the X direction, such that the support member 98 extends parallel to the X direction. The movable guide 92 is fixed to another support member 100. Two slide members (not shown) are fitted in respective grooves which are formed in an upper surface of the first table 72, apart from each other in the X direction, so that the two slide members are movable in the Y direction. Lengthwise opposite end portions of the support member 100 are fixed to respective upper end portions of the two slide members, so that the support member 100 extends parallel to the X direction and accordingly the movable guide 92 extends parallel to the X direction. Owing to the movement of the slide members, the movable guide 92 is moved toward, and away from, the fixed guide 90. Thus, a PWB-guide width of the PWB P-S device 52 (i.e., a distance between the fixed and movable guides 90, 92) can be adjusted depending upon the size of the PWB 20.

Two belt guides 104 are fixed, below the two hold-down portions 94, 96, to respective upper end portions of respective inner surfaces of the two support members 98, 100 which surfaces are opposed to each other. Two endless conveyor belts 106 are wound on the two belt guides 104, respectively. The two conveyor belts 106 are driven or circulated in synchronism with each other by a belt drive device (not shown) including a belt drive motor as a drive source. Two projecting members 110 are fitted in the two support members 98, 100, respectively, such that each of the projecting members 110 is movable upward and downward. Each of the two projecting members 110 has a plate-like shape, is elongate in the X direction, is located inside a corresponding one of the two conveyor belts 106, and is biased downward by a biasing member (e.g., a spring member, not shown). Two engaging pins 114 are fixed to opposite ends of each projecting member 110, respectively, that are distant from each other in the X direction, such that each of the engaging pins 114 extends downward.

In the state in which the first table 72 is kept at its lower movement-end position, the first table 72 and the PWB 20 placed on the first table 72 are positioned below the PWB carry-in and carry-out devices, and are moved with the Y table 70 in the X and Y directions without being interfered with by the carry-in and carry-out devices. The X table 62 has an opening 116 which extends in the Y direction and which permits the rods 76, 78 projecting downward from the Y table 70, and the connection bar 80, to be moved with the Y table 70 in the Y direction.

On the first elevator table 72, there is provided a second elevator table 120 such that the second table 120 can be elevated and lowered. The second table 120 has a plate-like shape, and a pair of guide rods 122 as guide members are fixed to a lower surface of the second table 120. The two guide rods 122 are fitted in respective guide bushings 124 fixed to a lower surface of the first table 72, such that each of the guide rods 122 is movable in its axial direction relative to a corresponding one of the guide bushings 124. The guide bushings 124 are fitted in respective holes formed through the thickness of the Y table 70, such that each of the bushings 124 is movable upward and downward relative to the Y table 70. A piston rod 128 of an air cylinder 126 as a sort of fluid-pressure-operated actuator as a drive source, and as a sort of fluid-pressure-operated cylinder device, is fixed to the lower surface of the second table 120. The air cylinder 126 is fixed to the first table 72 such that the air cylinder 126 extends in a vertical direction, and is fitted in a hole formed through the thickness of the Y table 70, such that the air cylinder 126 is movable upward and downward relative to the Y table 70.

As shown in FIG. 2, on the second table 120, there is provided a PWB positioning pin 130 which positions the PWB 20 in the X and Y directions, i.e., in a horizontal plane.

On the second table 120, there is also provided a PWB supporting device 132 which supports the PWB 20 under a lower surface thereof. Some ECs 17 have already been mounted on a first surface 134 of the PWB 20 that provides, after the PWB is turned upside down, the lower surface of the PWB 20 that is supported by the supporting device 132. Hereinafter, the other surface of the PWB 20 that is opposite to the first surface 134 will be referred to as a second surface 136. In FIG. 2, the second surface 136 is an upper surface on which some ECs 17 are to be mounted.

The PWB supporting device 132 includes a plurality of PWB supporting members 138 each of which includes a cylindrical base portion 140 and an upper tapered portion 142 whose diameter gradually decreases in an upward direction, and has a circular top surface providing a circular PWB supporting surface 144. Therefore, the PWB 20 is supported at a plurality of considerably small areas corresponding to the respective circular top surfaces 144 of the PWB supporting members 138. In the present embodiment, each of the PWB supporting surfaces 144 has a diameter of about 3 mm.

On each of the first and second surfaces 134, 136 of the PWB 20, a plurality of circular black fiducial marks ("F-marks") 146 (FIG. 5) are provided at respective positions which are distant from each other by a prescribed distance in a horizontal direction. It is preferred that at least two F-marks 146 be provided in at least two corners out of the four corners of the rectangular PWB 20. Each F-mark 146 may have any other color having a distinct contrast with respect to the background color of the PWB 20, and may have any other shape such as a cross or a triangle.

In the present embodiment, the F-marks 146 provided on the first surface 134 are not aligned with the F-marks 146 provided on the second surface 136. That is, the former F-marks 146 are provided on the first surface 134 at respective positions different from those where the latter F-marks 146 are provided on the second surface 136. However, the former F-marks 146 provided on the first surface 134 have a prescribed positional relationship with respect to the latter F-marks 146 provided on the second surface 136. Therefore, if the respective positions of the F-marks 146 provided on one of the first and second surfaces 134, 136 are determined, then it is possible to determine the respective positions of the F-marks 146 provided on the other of the first and second surfaces 134, 136. The reason why the F-marks 146 provided on the first surface 134 are not aligned with the F-marks 146 provided on the second surface 136 is to enable the EC mounting system 10 to judge, based on the respective positions (i.e., pattern of distribution) of the F-marks 146 provided on the current, upper surface of the PWB 20, whether the current upper surface is the first or second surface 134, 136 of the PWB 20. However, in the case where the EC mounting system 10 need not have this judging function, the F-marks 146 provided on the first surface 134 and the F-marks 146 provided on the second surface 136 may be aligned with each other.

The EC mounting system 10 includes an F-mark camera 150 which is supported by a frame (not shown) such that the camera 150 is immovable relative to the base 54 and is oriented vertically downward. The F-mark camera 150 takes an image of each of the F-marks 146 provided on the upper surface (i.e., second surface 136) of the PWB 20, in the state in which the each of the F-marks 146 is positioned at an image-take position right below the camera 150 after the PWB 20 is moved while being supported by the PWB P-S device 52.

The present EC mounting system 10 is controlled by a control device 152 shown in FIG. 3. The control device 152 is essentially provided by a computer 162 including a central processing unit (CPU) 154, a read only memory (ROM) 156, a random access memory (RAM) 158, and a bus 160 for coupling the elements 154, 156, 158 to one another. An input interface 164 is connected to the bus 160, and the F-mark camera 150 and an input device 166 are connected to the input interface 164. The input device 166 includes an operation panel and a keyboard which is operable by an operator. In addition, an output interface 168 is connected to the bus 160. The X-axis servomotor 58, the Y-axis servomotor 66, the rotating device (not shown) for rotating the index table 16, two elevating and lowering devices (not shown) for elevating and lowering each of the EC suction heads 18 at the EC-suck and EC-mount positions, respectively, a moving device for moving the movable guide member 92, and a display device 172 are connected to the output interface 168 via respective drive circuits 170. The F-mark camera 150 is also connected to the output interface 168 via a control circuit 174. The display device 172 includes a CRT (cathode ray tube) or LCD (liquid crystal display) that displays a screen image visually recognizable by a human person such as an operator.

The ROM 156 of the computer 162 stores, in advance, various control programs including an EC mounting program according to which the control device 152 controls the EC mounting system 10 to mount the ECs 17 on the PWB 20. In addition, the RAM 158 stores, for a plurality of sorts of PWBs 20, a plurality of groups of information each group of which includes not only information representing respective reference positions of the F-marks 146 provided on a corresponding one of the different sorts of PWBs 20 and information representing respective EC-mount locations where ECs 17 are to be mounted on the corresponding one sort of PWBs 20, but also a pair of F-mark-positional-error permission values, described later.

Figure 4A:
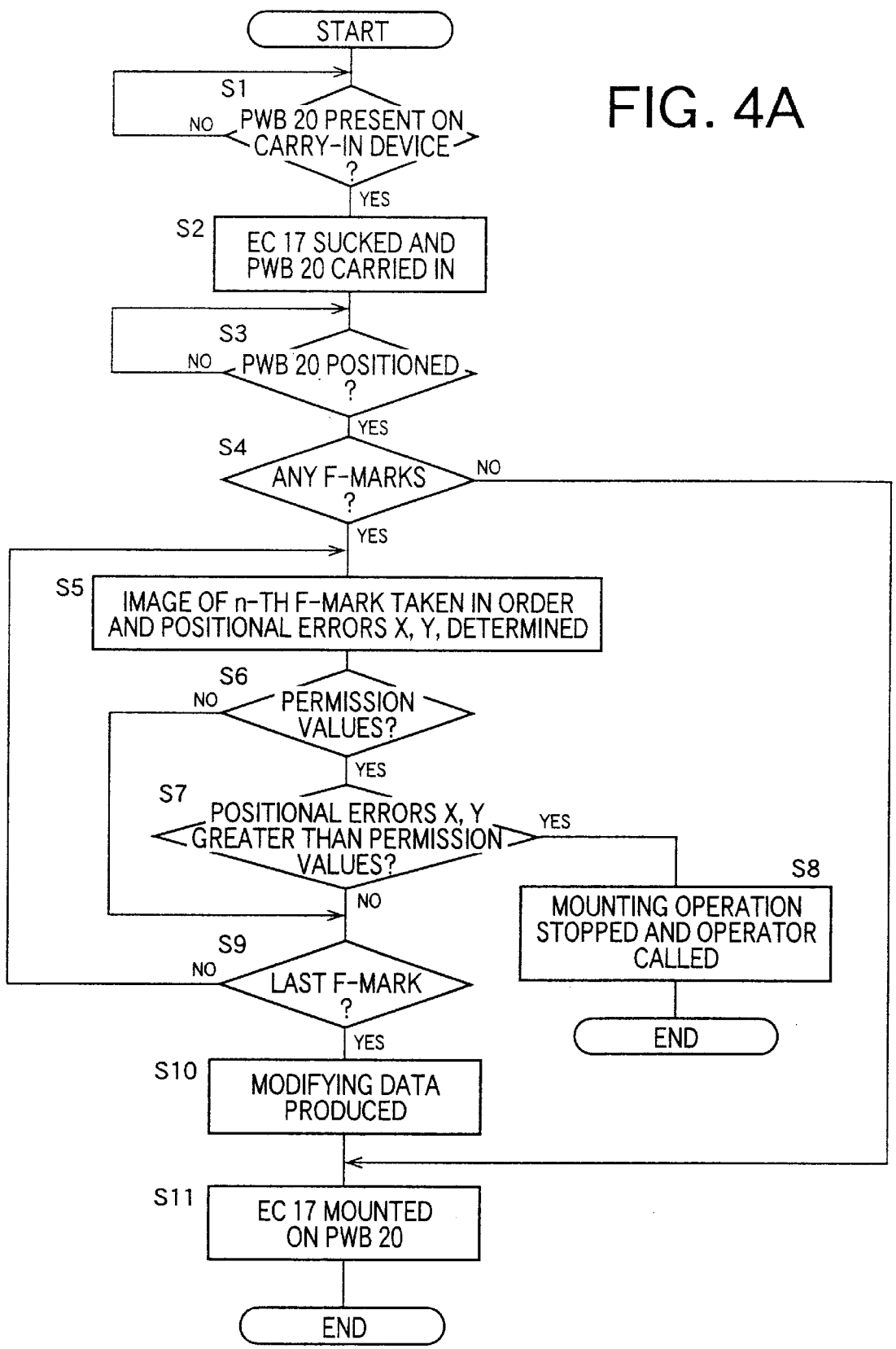
FIG. 4A is a flow chart representing an EC mounting program according to which the control device controls the EC mounting system.

Next, there will be described the operation of the EC mounting system 10 constructed as described above, by reference to the flow chart, shown in FIG. 4, representing the EC mounting program pre-stored in the ROM 156.

First of all, a brief explanation of the EC mounting program or operation is provided below.

When a PWB 20 is carried in, the pair of conveyor belts of the PWB carry-in device and the pair of conveyor belts 106 of the PWB P-S device 52 are driven or circulated. At this point of time, the first table 72 is kept at its upper movement-end position, and the second table 120 is kept at its lower movement-end position. Thus, as the two pairs of conveyor belts are circulated, the PWB 20 is carried in onto the PWB P-S device 52. The movement of the PWB 20 is stopped by a stopper (not shown) which is currently kept at its operative position. After the pair of conveyor belts 106 are stopped, the second table 120 is moved upward relative to the first table 72. When the second table 120 is elevated, the table 120 engages the engaging pins 114, thereby causing the projecting members 110 to be moved upward against the biasing forces of the biasing members (not shown). Consequently the PWB 20 is lifted up away from the conveyor belts 106. As the second table 120 is elevated, the PWB positioning pin 130 and the PWB supporting device 132 are elevated, so that the positioning pin 130 is fitted in a positioning hole (not shown) of the PWB 20. Thus, the PWB 20 is positioned relative to the second table 120. In addition, the PWB supporting members 138 of the PWB supporting device 132 contact respective portions of the first surface 134 of the PWB 20 that are free of the ECs 17 mounted on the first surface 134. Thus, the PWB supporting device 132 supports the PWB 20 under the first surface 134 thereof. When the PWB 20 is lifted up by the projecting members 110 and is just contacted with the hold-down portions 94, 96, the PWB supporting members 138 contact the PWB 20, and the PWB positioning pin 130 is fitted in the PWB positioning hole of the PWB 20 to position the PWB 20. The PWB 20 is positioned by the positioning pin 130, and is sandwiched and supported by the hold-down portions 94, 96 and the projecting members 110, and its lower (first) surface 134 is supported by the PWB supporting members 138.

Subsequently, the first table 72 is lowered. When ECs 17 are mounted on the PWB 20, the X table 62 and the Y table 70 are moved so that the PWB 20 is moved to an arbitrary position in the horizontal plane.

First, the PWB 20 is moved to the image-take position right below the F-mark camera 150, so that one of the F-marks 146 provided on the upper surface of the PWB 20 is taken by the camera 150. Based on the respective images of the F-marks 146 taken by the camera 150, the control device 152 produces modifying data for modifying respective amounts of movement of the PWB 20 in the X and Y directions that are needed to position each of the EC-mount locations on the PWB at a position right below the EC-mount position of the index table 16. In addition, based on the taken images of the F-marks 146, the control device 152 inspects or judges whether the PWB 20 is appropriately supported by the PWB supporting device 132, as will be described in detail later. If the control device 152 judges that the PWB 20 is appropriately supported, the control device 152 modifies, based on the modifying data, respective prescribed amounts of movement of the PWB 20 in the X and Y directions that are needed to position each of the EC-mount locations on the PWB 20 at the position right below the EC-mount position of the index table 16, so that each of the EC suction heads 18 mounts an EC 17 at each of the EC-mount locations on the PWB 20. On the other hand, if the control device 152 judges that the PWB 20 is inappropriately or abnormally supported, then the control device 152 stops the current EC mounting operation and operates the display device 172 to display a message indicating the negative judgment.

The plurality of EC suction heads 18 of the EC mounting device 12 are sequentially moved to the EC-suck position, as the index table 16 is intermittently rotated. At the EC-suck position, each of the EC suction heads 18 sucks and holds an EC 17 from the EC-supply portion of one EC feeder 32 being positioned at the EC-supply position. Subsequently, each head 18 is moved to the EC-mount position via the EC-posture-detect and EC-posture-correct positions. At the EC-mount position, each head 18 mounts the EC 17 on the second surface 136 of the PWB 20. Each head 18 is supported by the index table 16, such that the each head 18 can be lowered and then elevated, relative to the index table 16, for sucking or mounting the EC 17.

After all ECs 17 to be mounted on the PWB 20 have been mounted on the PWB 20, the X and Y tables 62, 70 are returned to their origin positions where the PWB P-S device 52 discharges the PWB 20 onto the PWB carry-out device. Then, the first table 72 is moved upward to its upper movement-end position and the second table 120 is moved downward to its lower movement-end position. Consequently the positioning pin 130 is disengaged from the positioning hole of the PWB 20, the PWB supporting members 138 of the PWB supporting device 132 are separated from the first surface 134, and the projecting members 110 are moved away from the hold-down portions 94, 96. Thus, the PWB 20 is released from the PWB P-S device 52. Then, the pair of conveyor belts of the PWB carry-out device and the pair of conveyor belts 106 of the PWB P-S device 52 are driven or circulated, so that the PWB 20 is discharged from the device 52 onto the carry-out device. After the discharging of the PWB 20, or concurrently with the discharging of the PWB 20, another PWB 20 on which some ECs 17 are to be mounted next is carried in onto the PWB P-S device 52. Thus, one EC mounting operation is finished.

Next, there will be described the method of inspecting whether the PWB 20 is appropriately supported by the PWB supporting device 132.

This method includes a step of taking, with the F-mark camera 150, respective images of the F-marks 146 provided on the PWB 20 supported by the PWB supporting device 132; a step of determining, based on respective batches of image data representing the taken images of the F-marks 146, respective actual positions of the PWB 20 relative to the PWB supporting device 132 in the X and Y directions; and a step of judging whether the determined actual X-direction and Y-direction positions of the PWB 20 fall within respective appropriate X-direction and Y-direction ranges. In the present embodiment, if the PWB 20 is supported at prescribed X-direction and Y-direction positions by the PWB supporting device 132, then the image of each of the F-marks 146 should be positioned at the center of the field of view of the F-mark camera 150. Therefore, if the image of one F-mark 146 is excessively deviated from the center of the view field of the camera 150, as shown in FIG. 5, respective amounts of deviation or error of the image of the F-mark 146 from the center of the view field in the X and Y directions are calculated as respective errors of the above-indicated respective actual positions of the PWB 20 relative to the PWB supporting device 132 in the X and Y directions. In the present embodiment, it is assumed that the F-mark camera 150 and the PWB supporting device 132 have no positional errors, and accordingly the above-indicated positional errors of the image of the F-mark 146 from the center of the view field in the X and Y directions can obtained as the respective errors of the respective actual positions of the PWB 20 relative to the supporting device 132 in the X and Y directions. Since the method of processing each batch of image data to determine the actual X-direction and Y-direction positions of the corresponding F-mark 146 is disclosed in, e.g., Japanese patent document No. 8-180191 and its corresponding U.S. Pat. No. 5,754, 677, no detailed description thereof is provided here. The disclosure of the U.S. patent is incorporated herein by reference.

After the respective positional errors of the actual X-direction and Y-direction positions of each F-mark 146 in the taken image from the corresponding prescribed positions are thus determined, the control device 152 judges, based on the thus determined positional errors, whether the PWB 20 is appropriately supported by the PWB supporting device 132. In the present embodiment, the F-marks 146 provided on the first surface 134 and the F-marks 146 provided on the second surface 136 have a prescribed positional relationship. Therefore, the control device 152 can determine or estimate, based on the respective actual positions of the F-marks 146 provided on the second surface 136, respective positions of the ECs 17 already mounted on the first surface 134, and accordingly can judge whether at least one of the ECs 17 on the first surface 134 is interfered with by at least one of the PWB support pins 138.

More specifically described, the control device 152 compares the X-direction and Y-direction positional errors of each of the F-marks 146 with prescribed X-direction and Y-direction positional-error permission values, respectively. If the respective positional errors of all the F-marks 146 are not greater than the corresponding permission errors, then the control device 152 judges that the PWB 20 is appropriately supported by the PWB supporting device 132, and commands continuing the current EC mounting operation. The X-direction and Y-direction permission values prescribed for each F-mark 146 are smaller than the respective shortest X-direction and Y-direction distances between any one of the ECs 17 provided on the first surface 134 and any one of the PWB support pins 138. In the present embodiment, each of the permission values is not greater than about 3 mm, more preferably not greater than 1.5 mm, and most preferably not greater than 0.5 mm Alternatively, it is possible to employ, as each of the permission values, substantially zero, so as to allow substantially no positional errors of the PWB 20 relative to the PWB supporting device 132.

On the other hand, if at least one of the X-direction and Y-direction positional errors of at least one of the F-marks 146 is greater than the corresponding permission value, the control device 152 judges that the PWB 20 is not appropriately, i.e., is abnormally, supported by the PWB supporting device 132, stops the current EC mounting operation, and informs the operator of the occurrence of abnormality of the mounting operation. More specifically described, the display device 172 displays an indication indicating that an abnormality has occurred, so that the operator responds to the indication so as to inspect the PWB 20 supported by the supporting device 132. If the operator finds no abnormality with the PWB 20, the operator inputs, through the input device 166, a command to resume the current EC mounting operation. On the other hand, if the operator finds an abnormality with the PWB 20, then he or she inputs, through the input device 166, a command to carry out the very PWB 20, thereby ending the current EC mounting operation.

Next, there will be described the EC mounting program by reference to the flow chart of FIG. 4. First, at Step S1, the control device judges whether a PWB 20 has been placed on the carry-in device. Step S1 is repeated till a positive judgment is made. When a positive judgment is made at Step S1, the control of the control device 152 goes to Step S2 to start operating the EC mounting device 12 and the EC supplying device 14 so that the EC suction heads 18 to suck respective ECs 17 from the EC feeders 32, and start operating the carry-in device and the PWB P-S device 52 to carry in the PWB 20. Step S2 is followed by Step S3 to judge whether the PWB 20 has reached a predetermined position on the P-S device 52. Step S3 is repeated till the PWB 20 reaches the predetermined position on the P-S device 52. If a positive judgment is made at Step S3, the control goes to Step S4 to judge whether the PWB 20 has any F-marks 146. More specifically described, the control device 152 judges whether a group of information, out of the plurality of groups of information pre-stored in the ROM 156, that corresponds to the sort of the current PWB 20 includes information about the F-marks 146 provided thereon and, if not, a negative judgment is made at Step S4, and the control skips Steps S5 to S10 and goes to Step S11. On the other hand, if a positive judgment is made at Step S4, the control device 152 reads, from the ROM 156, a total number, N, of the F-marks 146 provided on the second surface 136 of the PWB 20, prescribed positions of each of the F-marks 146, and respective sequential numbers, n, assigned to the F-marks 146. The sequential numbers n are associated with the respective prescribed positions of the F-marks 146, and indicate a predetermined order in which the F-mark camera 150 takes respective images of the F-marks 146.

Subsequently, at Step S5, the control device 152 operates the F-mark camera 150 and the PWB P-S device 52 to take an image of an n-th F-mark 146 on the second surface 136 of the PWB 20, and calculates, based on the image data representing the taken image, respective X-direction and Y-direction positional errors of the actual positions of the n-th F-mark 146 in the taken image from the corresponding prescribed positions. Step S5 is followed by Step S6 to judge whether the group of information corresponding to the sort of the current PWB 20 includes X-direction and Y-direction positional-error permission values for the n-th F-mark 146. If a negative judgment is made at Step S5, the control of the control device 152 skips Step S7 and goes to Step S9. On the other hand, if a positive judgment is made at Step S6, the control goes to Step S7 to judge whether each of the X-direction and Y-direction positional errors determined at Step S5 is greater than a corresponding one of the permission values. If a positive judgment is made at Step S7, the control goes to Step S8 to generate a stop signal to stop the current EC mounting operation and operate the display device 172 to display a message, such as "MARK-POSITION ERROR", "CHECK PWB", or "MARK POSITION ERRORS EXCEED PERMISSION VALUES. ADJUST POSITIONS OF PWB AND THEN RESUME MOUNTING OPERATION, OR DISCHARGE PWB". Here, the operator checks the PWB 20 supported on the PWB support members 138. If the operator finds no abnormality with the PWB 20, he or she adjusts the actual positions of the PWB 20 and then input a command to resume the EC mounting operation. The abnormality of the PWB 20 may be that at least one of the ECs 17 mounted on the first surface 134 has fallen off the surface 134, or that the current PWB 20 is an incorrect sort of PWB. In those cases, the operator inputs a command to discharge or carry out the PWB 20 from the PWB P-S device 52, thereby ending the current EC mounting operation.

On the other hand, if a negative judgment is made at Step S7, the control proceeds with Step S9 to judge whether the n-th F-mark 146 is the last F-mark 146 in the predetermined order, that is, whether the sequential number n is equal to the total number N. If a positive judgment is made at Step S9, the control goes to Step S10 to produce, based on the respective positional errors of the F-marks 146 determined at Step S5, modifying data to modify respective prescribed amounts of movement of the X-Y table 50 that are needed to move the PWB 20 in such a way that a corresponding one of the EC-mount places on the second surface 136 of the PWB 20 is moved to, and positioned at, a position right below the EC-mount position of the index table 16. Step S10 is followed by Step S11 to move, based on the above-indicated prescribed amounts of movement and the thus produced modifying data, the X-Y table 50 so that the above-indicated one EC-mount place on the PWB 20 is positioned at the position right below the EC-mount position, and operate the EC suction head 18 holding the current EC 17 to mount the same 17 on the PWB 20. Then, the twelve EC suction heads 18 sequentially mount respective ECs 17 on the respective EC-mount places on the second surface 136 of the PWB 20. When all the ECs 17 have been mounted on the second surface 136, the PWB 20 is carried out from the PWB P-S device 52 onto the carry-out device.

If a negative judgment is made at Step S9, the control goes back to Step S5 and the following steps.

In the present EC mounting system 10, it is assumed that there is no positional error between the F-mark camera 150 as the image taking device and the PWB Positioning and supporting device 52 as the moving device, that is, that the positional errors of each of the F-marks 146 result entirely from the positional errors of the PWB 20 relative to the PWB supporting device 132. On this assumption, the control device 152 judges whether the PWB 20 is appropriately supported by the supporting device 132, and produces, based on the positional errors of the F-marks 146, modifying data to modify the prescribed amounts of movement of the X-Y table 50 needed to move each of the EC-mount places on the PWB 20 to the position right below the EC-mount position of the index table 16. Thus, the control device 152 can judge whether the PWB 20 has an abnormality, for example, whether at least one of the ECs 17 mounted on the first surface 134 of the PWB 20 is interfered with by at least one of the PWB support members 138. If the control device 152 finds an abnormality of the PWB 20, then it stops the current EC mounting operation, so that no ECs 17 are mounted on the PWB 20. Thus, the present EC mounting system can minimize the wasteful use of ECs 17.

It is noted that in the case where the positional errors between the F-mark camera 150 as the image taking device and the PWB P-S device 52 as the moving device are known in advance, it is possible to judge, while taking those positional errors into account, whether the positional errors of the PWB 20 relative to the PWB supporting device 132 or the PWB P-S device 52 are greater than the prescribed permission values, and/or to modify, while taking those positional errors into account, the prescribed amounts of movement of the X-Y table 50.

Moreover, if it is judged, at Step S5, that no image of the n-th F-mark 146 is present in the taken image, that is, that the X-direction and Y-direction positional errors of the n-th F-mark 146 are greater than respective halves of X-direction and Y-direction dimensions of the field of view of the F-mark camera 150, the control device 152 may judge it as a failure to recognize the n-th F-mark 146, so that the control of the control device 152 may directly go to Step S8 to stop the current EC mounting operation.

In the illustrated embodiment, the control device 152 judges whether the PWB 20 is appropriately supported, by judging whether the respective positional errors (i.e., respective distances) of each F-mark 146 in the taken image from the center of the view field of the camera 150 are not greater than the permission ranges. However, it is possible to pre-set, in the view field of the camera 150, a prescribed permission range 180, shown in FIG. 5. If the positional errors of each F-mark 146 fall within the permission range 180, the control device 152 judges that the PWB 20 is appropriately supported; and if not, the control device 152 judges that the PWB 20 is abnormally supported. Though the permission range 180 shown in FIG. 5 has a rectangular shape, the range 180 may have a circular or square shape, or alternatively may have a shape asymmetrical with respect to the center of the view field of the camera 150.

In the illustrated embodiment, the control device 152 judges whether the PWB 20 is appropriately supported, based on the positional errors of the actual positions of each of the F-marks 146 from the corresponding prescribed positions. However, the control device 152 may additionally determine a relative position between appropriate two F-marks, or two F-marks of each of pairs of appropriate F-marks, selected from all the F-marks 146. In the latter case, the control device 152 judges whether the PWB 20 is appropriately supported, based on not only the positional errors of the actual positions of each of the F-marks 146 from the corresponding prescribed positions but also positional errors of the actual relative positions of each pair of F-marks 146 from corresponding prescribed relative positions. More specifically described, the control device 152 determines, based on the respective amounts of movement of the X-Y table 50 needed to take the image of the n-th F-mark 146 and the taken image of the n-th F-mark 146, the distance between the (n−1)-th F-mark 146 and the n-th mark 146, and judges, based on the thus determined distance and a prescribed distance, whether the PWB 20 is appropriately supported. Even in the case where the positional errors of each of the F-marks 146 measured in the X and Y directions on the horizontal plane are not greater than the prescribed permission values, the PWB 20 may have an abnormal shape. For example, in the case where the respective heights of the PWB support members 138 do not correspond to the height position at which the PWB 20 is sandwiched by the hold-down portions 94, 96 and the projection members 110, the PWB 20 may sag downward because of its own weight, or may be warped upward because of being pushed up by the support members 138. In addition, if one or more ECs 17 already mounted on the first surface 134 are sandwiched by, and between, the PWB 20 and one or more support members 138, the PWB 20 may be warped upward. In each case, the distance between two F-marks 146 around the sagging or warped portion of the PWB 20 differs from the prescribed distance, and this difference can be used to identify an abnormality with the PWB 20.

Figure 4B:
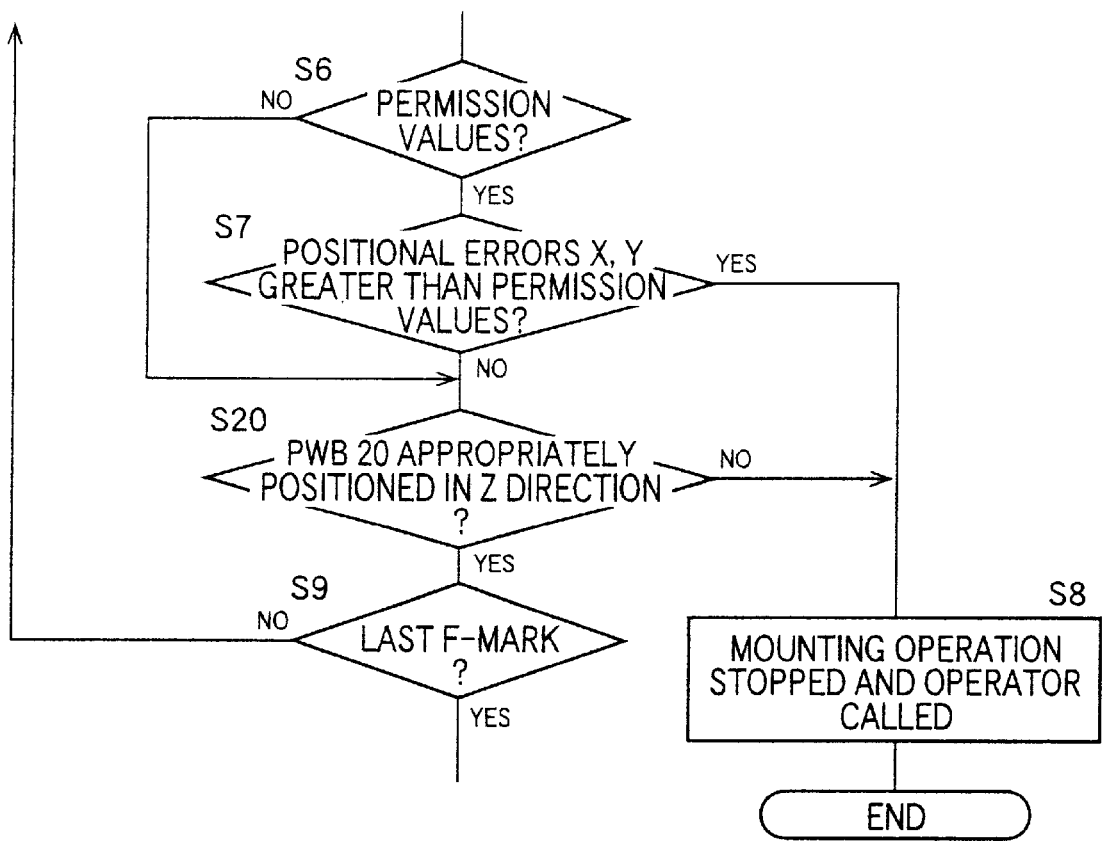
FIG. 4B is another flow chart representing another EC mounting program according to which the control device may control the EC mounting system in a second embodiment of the present embodiment.
Figure 6A:
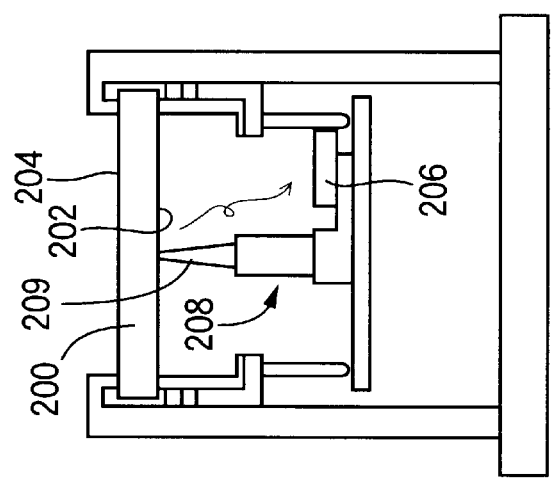
FIGS. 6A, 6B, and 6C are views for explaining problems which are encountered in the conventional art.
Figure 6B:
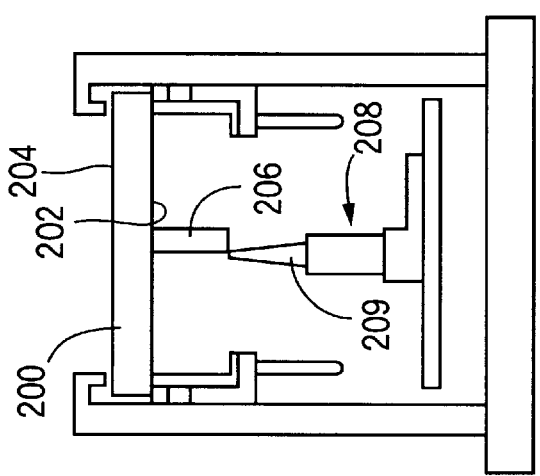
Figure 6C:
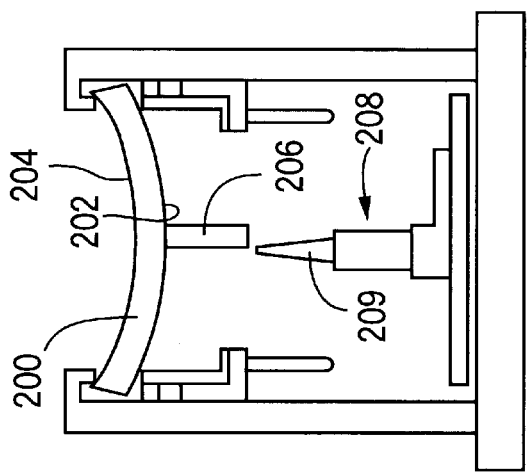

In a second embodiment of the present invention, an additional step, S20, shown in FIG. 4B, is inserted between Steps S7 and S9, 50 that the control device 152 judges whether the PWB 20 is appropriately supported by the PWB supporting device 132 or the PWB P-S device 52, with respect to the Z direction. In this embodiment, at least one of the five F-marks 146 is provided around the center of each of the first and second surfaces 134, 136 of the PWB 20. If the PWB 20 is deformed such that it is upwardly or downwardly convex (or concave), the image of the F-mark 146 taken by the F-mark camera 150 may not have a sufficiently sharp outline because the height (i.e., Z-direction) position of the F-mark 146 may be largely deviated from the focal point of the F-mark camera 150. The control device 152 may judge whether the taken image of the F-mark 146 has a sufficiently sharp outline, by judging whether the greatest one of respective rates of change of respective optical characteristic values (e.g., luminance or hue values) at respective positions on a straight reference line intersecting the processed outline of the taken image of the F-mark 146, measured or calculated in a prescribed direction along the reference line, is greater than a reference or threshold value. The technique of determining the greatest rate of change of the optical characteristic values is also disclosed in the previously-mentioned Japanese patent document No. 8-180191 and its corresponding U.S. Pat. No. 5,754,677. The F-mark or F-marks 146 maybe replaced with one or more prescribed portions of a circuit pattern (e.g., wires, bumps, etc.) of the PWB 20 itself. If a negative judgment is made at Step S20, the control goes to Step S8; and if a positive judgment is made at Step S20, the control goes to Step S9.

In a third embodiment of the present invention, the frame (not shown) supports, in addition to, or in place of, the F-mark camera 150, a laser distance meter (not shown), well known in the art. The laser distance meter includes a laser-beam emitter which emits a laser beam toward each of three prescribed detection portions (e.g., a central portion and two diagonal corner portions) of the PWB 20 positioned and supported by the PWB P-S device 52, and a laser-beam detector which detects the laser beam reflected by the each of the detection portions of the PWB 20, calculates, based on the detected propagation times, and an emission speed, of the laser beams, respective distances between the distance meter and the three detection portions of the PWB 20, and determines, as a height position of the PWB 20, an average of the respective calculated distances between the distance meter and the three detection portions of the PWB 20. Based on the thus determined height position of the PWB 20, the control device 152 judges whether the PWB 20 is appropriately supported by the PWB P-S device 52, i.e., is appropriately positioned in the Z direction (i.e., vertical direction) perpendicular to the X and Y directions.

In the third embodiment, it is possible that the laser distance meter emit the laser beam to a single prescribed portion (i.e., the central portion) of the PWB 20, calculate, based on the detected propagation time, and the emission speed, of the laser beam, a distance between the distance meter and the PWB 20, and determine, based on the calculated distance, a height position of the PWB 20.

In the third embodiment, an additional step is inserted between Steps S9 and S10, so that the control device 152 judges, based on the thus determined height position of the PWB 20, whether the PWB 20 is appropriately supported by the PWB supporting device 132 or the PWB P-S device 52, with respect to the Z direction.

It is to be understood that the present invention may be embodied with other changes, modifications, and improvements, such as those described in SUMMARY OF THE INVENTION, which may occur to a person skilled in the art, without departing from the spirit and scope of the invention defined in the appended claims.

What is claimed is:

1. A method of inspecting whether a printed board is appropriately supported by a supporting device, when a holding device holding an electric component mounts the electric component on one of opposite surfaces of the printed board the other surface of which has at least one electric component already mounted thereon and is engaged with the supporting device, the supporting device including at least one support member having at least one two-dimensional support spot which supports the printed board by engaging said other surface thereof at at least one support location prescribed for a sort of the printed board, the method comprising the steps of:

taking, with an image taking device, an image of at least one prescribed detection portion of said one surface the printed board said other surface of which is supported by the supporting device, and judging, based on image data representing the taken image of said at least one detection portion of said one surface of the printed board, whether said at least one electric component already mounted on said other surface of the printed board is interfered with by said at least one support member of the supporting device.

2. The method according to claim 1, wherein the step of taking comprises taking an image of at least one reference mark provided on said one surface of the printed board said other surface of which is supported by the supporting device.

3. The method according to claim 1, wherein the step of judging comprises:

prescribing a two-dimensional permission range which assures that said at least one electric component already mounted on said other surface of the printed board is not interfered with by said at least one support member of the supporting device, determining, based on the image data representing the image of said at least one prescribed detection portion of said one surface of the printed board, an actual position of the printed board supported by the supporting device, and judging, when the determined actual position of the printed board falls within the prescribed two-dimensional permission range, that said at least one electric component already mounted on said other surface of the printed board is not interfered with by said at least one support member of the supporting device.

4. The method according to claim 3, wherein the step of determining comprises determining an actual position of each of a plurality of prescribed detection portions of the printed board in each of a first direction and a second direction which are parallel to the printed board supported by the supporting device and are perpendicular to each other.

5. The method according to claim 1, further comprising the step of outputting, with an output device, information representing a result of the judgment, such that the output information is recognizable by an operator.

6. The method according to claim 5, wherein the step of outputting comprises outputting information representing a positive result of the judgment.

7. The method according to claim 1, further comprising the step of, when it is judged that said at least one electric component already mounted on said other surface of the printed board is interfered with by said at least one support member of the supporting device, stopping a mounting operation in which the holding device will mount the electric component on said one surface of the printed board.

8. The method according to claim 1, wherein the step of judging comprises judging whether the printed board is appropriately supported by the supporting device in a direction perpendicular to the printed board supported by the supporting device and, if a negative judgment is made, judging that said at least one electric component already mounted on said other surface of the printed board is interfered with by said at least one support member of the supporting device.

9. The method according to claim 8, wherein the step of judging comprises judging whether a rate of change of respective optical characteristic values at respective positions on a line intersecting an edge line of the taken image of said at least one detection portion, with respect to a direction along the line, is greater than a threshold value and, if a negative judgment is made, judging that said at least one electric component already mounted on said other surface of the printed board is interfered with by said at least one support member of the supporting device.

10. A method of inspecting whether a printed board is appropriately supported by a supporting device, when a holding device holding an electric component mounts the electric component on one of opposite surfaces of the printed board the other surface of which has at least one electric component already mounted thereon and is engaged with the supporting device, the supporting device including at least one support member having at least one two-dimensional support spot which supports the printed board by engaging said other surface thereof at at least one support location prescribed for a sort of the printed board, the method comprising the steps of:

detecting a height position of at least one prescribed detection portion of said one surface of the printed board said other surface of which is supported by the supporting device, and judging, based on the detected height position of said at least one detection portion, whether said at least one electric component already mounted on said other surface of the printed board is interfered with by said at least one support member of the supporting device.

11. An apparatus for mounting at least one electric component on a printed board, comprising:

a supporting device which supports the printed board by engaging a lower surface thereof that has at least one electric component already mounted thereon, the supporting device including at least one support member having at least one two-dimensional support spot which supports the printed board by engaging the lower surface thereof at at least one support location prescribed for a sort of the printed board;

a holding device which holds the electric component and mounts the electric component on an upper surface of the printed board the lower surface of which is supported by the supporting device;

an image taking device which takes an image of at least one detection portion of the upper surface of the printed board the lower surface of which is supported by the supporting device; and a control device which controls the supporting device, the holding device, and the image taking device to mount the electric component on the upper surface of the printed board, the control device comprising a judging portion which judges, based on image data representing the image of said at least one detection portion taken by the image taking device, whether said at least one electric component already mounted on the lower surface of the printed board is interfered with by said at least one support member of the supporting device.

12. The apparatus according to claim 11, wherein the image taking device takes an image of at least one reference mark which is provided on the upper surface of the printed board the lower surface of which is supported by the supporting device.

13. The apparatus according to claim 11, wherein the control device further comprises:

a memory which stores a prescribed two-dimensional permission range which assures that said at least one electric component already mounted on the lower surface of the printed board is not interfered with by said at least one support member of the supporting device; and an actual-position determining portion which determines, based on the image data representing the image of said at least one detection portion of the upper surface of the printed board, an actual position of the printed board supported by the supporting device, wherein the judging portion judges, when the determined actual position of the printed board falls within the prescribed two-dimensional permission range, that said at least one electric component already mounted on the upper surface of the printed board is not interfered with by said at least one support member of the supporting device.

14. The apparatus according to claim 11, wherein the judging portion judges whether the printed board is appropriately supported by the supporting device in a direction perpendicular to the printed board supported by the supporting device and, if a negative judgment is made, judging that said at least one electric component already mounted on the lower surface of the printed board is interfered with by said at least one support member of the supporting device.

15. A recording medium in which an inspecting program is recorded such that the inspecting program is readable by a computer to cooperate with an image taking device to inspect whether a printed board is appropriately supported by a supporting device in an electric-component mounting apparatus in which a holding device holding an electric component mounts the electric component on one of opposite surfaces of the printed board the other surface of which has at least one electric component already mounted thereon and is engaged with the supporting device, the supporting device including at least one support member having at least one two-dimensional support spot which supports the printed board by engaging said other surface thereof at at least one support location prescribed for a sort of the printed board at least one of the holding device holding the electric component and the supporting device supporting the printed board being movable relative to the other of the holding device and the supporting device, the inspecting program comprising the steps of:

taking, with the image taking device, an image of at least one detection portion of said one surface of the printed board said other surface of which is supported by the supporting device, and judging, based on image data representing the taken image of said at least one detection portion of said one surface of the printed board, whether said at least one electric component already mounted on said other surface of the printed board is interfered with by said at least one support member of the supporting device.

16. The recording medium according to claim 15, wherein the step of taking comprises taking an image of at least one reference mark which is provided on said one surface of the printed board said other surface of which is supported by the supporting device.

17. The recording medium according to claim 15, wherein the step of judging comprises:

prescribing a two-dimensional permission range which assures that said at least one electric component already mounted on said other surface of the printed board is not interfered with by said at least one support member of the supporting device, determining, based on the image data representing the image of said at least one detection portion of said one surface of the printed board, an actual position of the printed board supported by the supporting device, and judging, when the determined actual position of the printed board falls within the prescribed two-dimensional permission range, that said at least one electric component already mounted on said other surface of the printed board is not interfered with by said at least one support member of the supporting device.

18. The recording medium according to claim 15, wherein the step of judging comprises judging whether the printed board is appropriately supported by the supporting device in a direction perpendicular to the printed board supported by the supporting device and, if a negative judgment is made, judging that said at least one electric component already mounted on said other surface of the printed board is interfered with by said at least one support member of the supporting device.

* * * * *